United States Patent
Yuan et al.

(10) Patent No.: US 6,320,345 B1
(45) Date of Patent: Nov. 20, 2001

(54) COMMAND TRAJECTORY FOR DRIVING A STAGE WITH MINIMAL VIBRATION

(75) Inventors: Bausan Yuan, San Jose, CA (US); Kazuaki Saiki, Tokyo (JP); Henry Kwok Pang Chau, San Francisco, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/036,401

(22) Filed: Mar. 5, 1998

(51) Int. Cl.[7] .......................................................... H02P 7/04
(52) U.S. Cl. .......................................... 318/569; 318/592
(58) Field of Search ...................... 318/443, 567, 318/569, 570, 566, 571, 600, 623, 671, 592, 593, 594, 568.12, 611, 649

(56) References Cited

U.S. PATENT DOCUMENTS

| | | | |
|---|---|---|---|
| 3,350,612 | 10/1967 | Hansen et al. | 318/143 |
| 3,886,421 | 5/1975 | Hassan et al. | 318/593 |
| 3,904,945 * | 9/1975 | Hassan et al. | 318/593 |
| 4,221,995 | 9/1980 | Barkman | 318/616 |
| 4,456,860 | 6/1984 | Cann et al. | 318/561 |
| 4,525,659 * | 6/1985 | Imahashi et al. | 318/611 |
| 4,577,141 | 3/1986 | Saiki et al. | 318/590 |
| 4,769,583 * | 9/1988 | Goor | 318/568.18 |
| 4,818,885 | 4/1989 | Davis et al. | 250/492.2 |
| 4,952,858 * | 8/1990 | Galburt | 318/647 |
| 4,987,526 * | 1/1991 | Slocum et al. | 364/167.01 |
| 5,033,853 * | 7/1991 | Frangineas, Jr. | 356/346 |
| 5,070,287 | 12/1991 | Boehm | 318/569 |
| 5,153,494 | 10/1992 | Hollis, Jr. | 318/640 |
| 5,159,254 * | 10/1992 | Teshima | 318/611 |
| 5,184,055 | 2/1993 | Ohishi et al. | 318/615 |
| 5,196,745 | 3/1993 | Trumper | 310/12 |
| 5,249,118 | 9/1993 | Smith | 364/167.01 |
| 5,331,542 * | 7/1994 | Itoh | 318/568.18 |
| 5,478,043 | 12/1995 | Wakui | 248/550 |
| 5,504,407 * | 4/1996 | Wakui et al. | 318/568.17 |
| 5,545,962 | 8/1996 | Wakui | 318/677 |
| 5,589,748 * | 12/1996 | Kazama et al. | 318/560 |
| 5,623,853 * | 4/1997 | Novak et al. | 74/490.09 |
| 5,638,267 * | 6/1997 | Singhose et al. | 364/148 |
| 5,684,375 * | 11/1997 | Chaffee et al. | 318/565 |
| 5,708,342 * | 1/1998 | Nihei | 318/568.18 |
| 5,720,010 * | 2/1998 | Watanabe et al. | 318/568.18 |
| 5,828,573 * | 10/1998 | Hayashi | 364/468.28 |
| 5,854,544 * | 12/1998 | Speth et al. | 318/568.18 |
| 5,981,962 * | 11/1999 | Groves et al. | 250/492.23 |
| 5,996,437 * | 12/1999 | Novak et al. | 74/490.09 |
| 6,000,280 * | 12/1999 | Miller et al. | 73/105 |

* cited by examiner

*Primary Examiner*—Robert E. Nappi
*Assistant Examiner*—Rina I. Duda
(74) *Attorney, Agent, or Firm*—Skjerven Morrill MacPherson LLP; Norman R. Klivans; Michael J. Halbert

(57) ABSTRACT

A command trajectory drives a stage to produce a smooth motion while minimizing any vibrations or oscillations of the structure. The command trajectory provides an acceleration and a deceleration that have derivatives, known as the jerk, equal to zero at the beginning and end of the acceleration and deceleration periods. Because the jerk is equal to zero at the beginning and end of acceleration and deceleration, the influence of the reactive forces on the positioning system's structure is reduced, thereby minimizing oscillation of the structure. Moreover, the jerk is continuous throughout the acceleration and deceleration periods, resulting in a smooth continuous motion of the stage. The jerk on the stage during acceleration and deceleration has an adjustable duration to reduce the structural disturbances and decrease settling time.

34 Claims, 6 Drawing Sheets

FIG. 1A (Pos.) (Prior Art)
FIG. 1B (Vol.) (Prior Art)
FIG. 1C (Acc.) (Prior Art)
FIG. 1D (Jerk) (Prior Art)

(Pos.)

(Vel.)

(Acc.)

(Jerk)

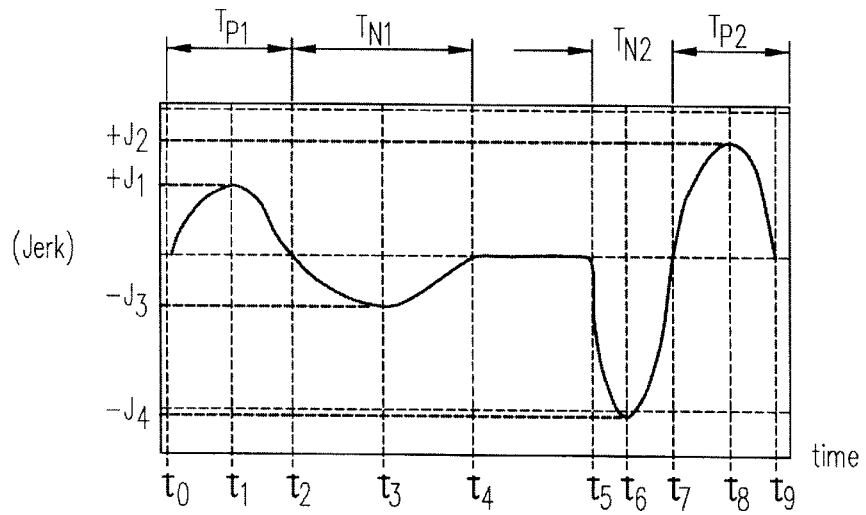
FIG. 7
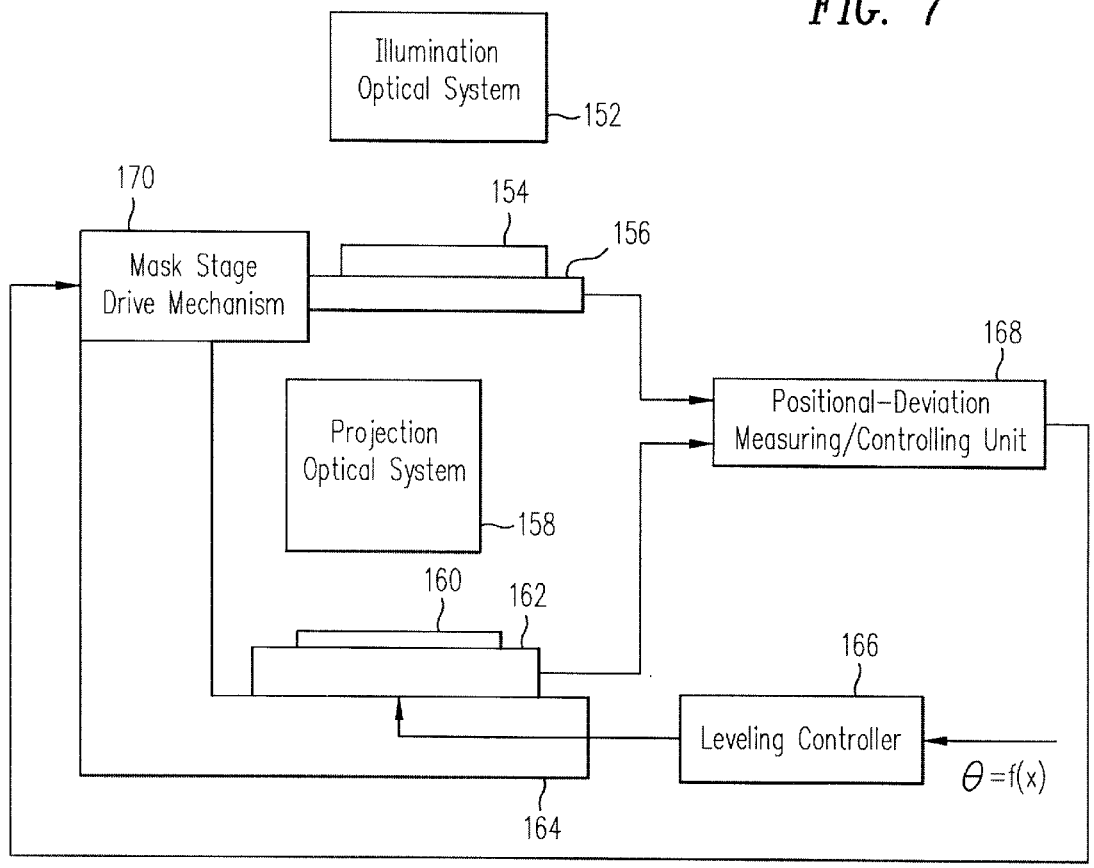
FIG. 8
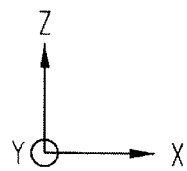

COMMAND TRAJECTORY FOR DRIVING A STAGE WITH MINIMAL VIBRATION

FIELD OF THE INVENTION

The present invention relates to controlling a stage in a high precision positioning system and in particular to a command trajectory that minimizes structural vibrations and discontinuities during stage travel.

BACKGROUND

High precision positioning systems, such as a microlithographic systems, require a smooth stage motion that produces a minimal amount of structural vibration or oscillation in the system's structure. Although most conventional positioning systems are supported by anti-vibration devices in an attempt to minimize disturbances, the unavoidable acceleration and deceleration of the stage produces forces on the positioning system which often result in small oscillations of the positioning system's structure.

FIGS. 1A–1D show respectively the position, velocity, acceleration, and "jerk" of a positioning system's stage (not shown) moving during a conventional scan. The X axes of FIGS. 1A–1D represent the position, velocity, acceleration, and jerk of the stage with respect to time, which is represented along the Y axes.

As shown in FIG. 1A, the stage moves from position 0 to X between times to and $t_0$ and $t_5$. The stage is moving at a constant velocity $V_C$ between times $t_2$ and $t_3$ and is stationary before time $t_0$ and after time $t_5$ as illustrated in FIG. 1B. However, a settling period exists between time $t_2$ and $t_{set}$, during which any oscillations generated during the acceleration of the stage are allowed to dissipate.

FIG. 1C illustrates the acceleration and deceleration of the stage during a conventional scan. As shown in FIG. 1C, the acceleration increases in a linear manner until at time $t_1$ the acceleration is at +A, at which time the acceleration of the stage decreases until it is back at 0 at time $t_2$. Thus, at time $t_2$ the stage will have a constant velocity $V_C$ shown in FIG. 1B. The stage then linearly decelerates between times $t_3$ to $t_5$ with a maximum deceleration at time $t_4$.

FIG. 1D illustrates the jerk on the stage. The jerk is equal to the derivative of the acceleration of the stage with respect to time. As shown in FIG. 1D, during acceleration the jerk on the stage is at +J from time $t_0$ to $t_0$, at –J from time $t_1$ to $t_2$, and 0 at time $t_2$. Thus, as illustrated in FIG. 1D, during acceleration there are discontinuities in the jerk at times $t_0$, $t_1$ and $t_2$. Further, when the acceleration of the stage begins and ends at times $t_0$ and $t_2$, the jerk is equal to +J and –J, respectively. A similar, but opposite jerk, occurs during deceleration of the stage, as illustrated in FIG. 1D.

A discontinuous jerk on a stage will create discontinuities in the motion of the stage during the scan, thus vibrating the stage. Moreover, a large jerk at the beginning and end of the acceleration and deceleration of the stage will produce a large reactive force, which consequently excites the positioning system's structure and creates large oscillations. Small vibrations or oscillations in a positioning system, such as a microlithography machine, will have a large deleterious effect where the system is expected to position stages with sub-micron accuracy.

Consequently, in a conventional positioning system in which oscillations occur, a settling period, between times $t_2$ and $t_{set}$, is often required during which the oscillations are allowed to dissipate. The amount of time the stage needs to reach scanning stability at a constant velocity increases due to the increase or need for settling. Thus, the settling period reduces the throughput of a system.

SUMMARY

A position control apparatus that drives a stage with a trajectory command in accordance with the present invention provides a motion to the stage that minimizes any discontinuities and disturbances in the motion that create vibration or oscillations of the structure. A trajectory command in accordance with the present invention provides a continuous and piece-wise linear or sine wave function jerk during acceleration and deceleration of the stage, which generates a smooth continuous motion of the stage. Moreover, the values of the acceleration (and deceleration) and the jerk are equal to zero at the start and finish of the acceleration (and deceleration), which reduces the influence of reactive forces and thus minimizes oscillation of the system's structure.

The jerk on the stage during acceleration and deceleration has an adjustable time period (duration) to reduce the structural disturbances. The ratio between the positive peak value and negative peak value of the jerk during acceleration is adjustable, but is equal to the ratio between the negative jerk period and the positive jerk period during acceleration. The same is true during deceleration of the stage. These ratios can be adjusted to minimize structural vibration and decrease settling time of individual systems. Moreover, the ratios used during acceleration may differ from the ratios used during deceleration of the stage and these ratios may be individually adjusted.

BRIEF DESCRIPTION OF THE DRAWINGS

The above and other features, aspects, and advantages of the present invention will become better understood with regard to the following description, appended claims, and accompanying figures, where:

FIG. 7 shows an additional embodiment of the jerk on a stage with respect to time and in accordance with the present invention.

FIG. 8 is a drawing to schematically show the structure of a scanning exposure apparatus provided with a feedback control system.

DETAILED DESCRIPTION

Figure 2:
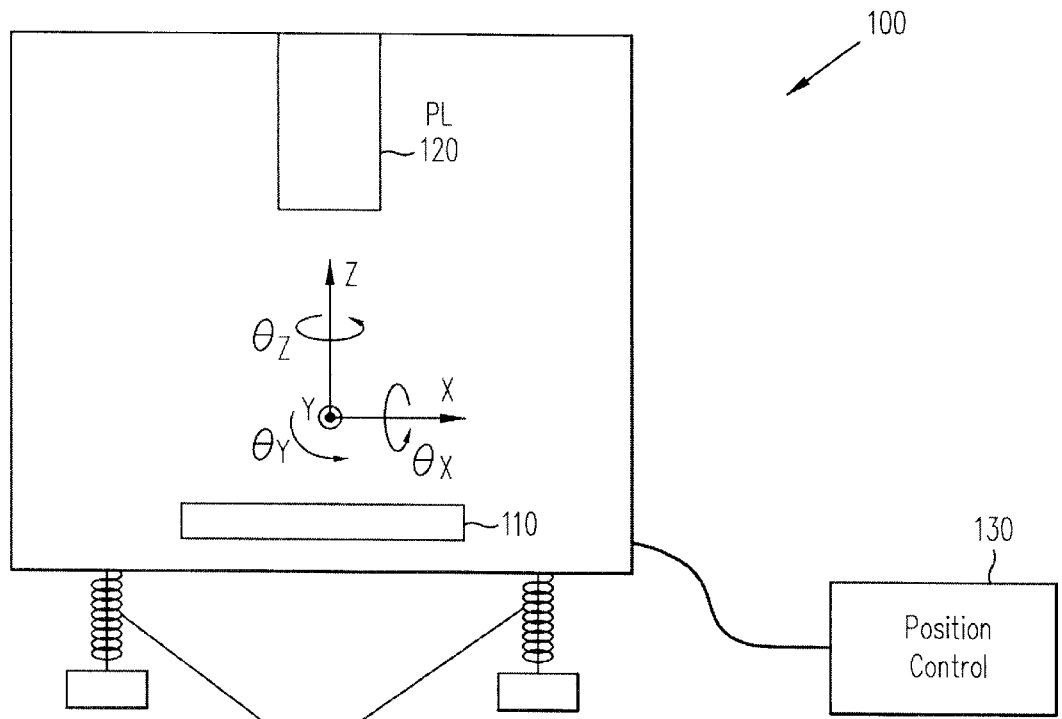
FIG. 2 shows a front view of a simplified scanning microlithographic positioning table mechanism including a position control apparatus that provides a trajectory command to a stage in accordance with the present invention.

FIG. 2 shows a front view of a simplified scanning microlithographic positioning table mechanism 100. Table mechanism 100 conventionally includes an anti-vibration device 105, a stage 110, a projection lens 120, and a position control apparatus 130, which provides the trajectory command to stage 110 in accordance with the present invention. The trajectory command that is provided by position control apparatus 130 is described below in reference to FIGS. 6A–6D.

The present invention is also related to already filed application entitled "Scanning Exposure Apparatus," by Kazuaki Saiki and Tomohide Hamada, Ser. No. 08/747,879, now U.S. Pat. No. 6,084,244, issued Jul. 4, 2000, and having the same assignee, the contents of which are incorporated herein by reference.

Figure 1:
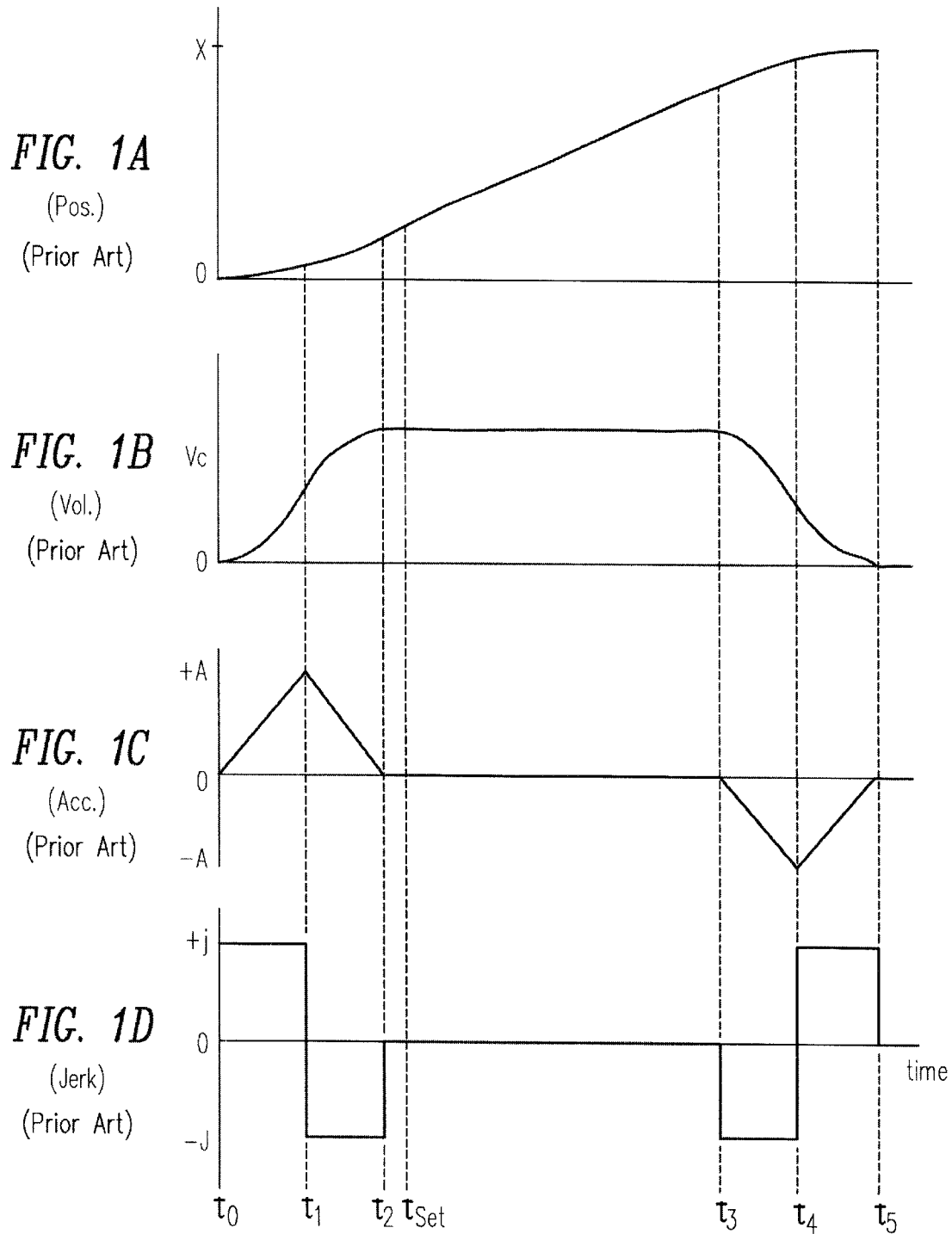
FIGS. 1A–1D show respectively the position, velocity, acceleration and jerk of a stage with respect to time in accordance with the prior art.

Table mechanism 100 may also include an additional stage, for instance to carry a mask (reticle), and illumination apparatus, both of which are not shown in FIG. 2 for the sake of clarity. Although the present invention is described with reference to scanning microlithographic positioning table mechanism 100 with a single stage 110, it is understood that the present invention applies to any high-precision positioning system regardless of the number of stages and the use of the system. For example, the present invention may be applied to the positioning system shown in FIG. 8, which corresponds to FIG. 1 of U.S. Pat. No. 6,084,244, referenced above. FIG. 8 is a drawing to schematically show the structure of a scannmg exposure apparatus provided with a feedback control system. In FIG. 8, an illumination optical system 152 uniformly illuminates patterns formed on a mask 154 mounted on a mask stage 156, and the patterns are projected through a projection optical system 158 to a photosensitive substrate 160 mounted on a substrate stage 162 to effect exposure thereon. The mask stage 156 and substrate stage 162 are unitedly supported by a carriage 164 and scanned in the X direction in the drawing upon projection exposure.

Specifically, a leveling control unit 166 leveling-drives the substrate stage 162, based on a leveling angle command corresponding to configurations of the surfaces of mask 154 and substrate 160.

The leveling adjustment during scanning exposure will generate the relative positional deviation in the x direction and the Y direction between the mask 154 and the substrate 160. Also, the relative positional deviation is caused in the X direction and the Y direction by other disturbance factors (for example, pitching and rolling motions of the carriage). Thus, a positional deviation measuring and controlling portion 168 measures the relative positional deviation between the mask stage 156 and the substrate stage 162, that is, the relative positional deviation between the mask 154 and the substrate 160. Based on the information on the relative positional deviation thus measured, the positional deviation measuring and controlling portion 168 finely adjusts the mask stage 156, in turn the mask 154, through a mask stage drive mechanism 170 within the XY plane so as to minimize the relative positional deviation between the mask 154 and the substrate 160. In this manner, a position feedback loop is constructed to measure the relative positional deviation between mask 154 and substrate 160, actually generated by the leveling drive and other disturbance factors, and to control the position of the mask stage 156 so as to minimize an amount of the relative positional deviation measured.

Stage 110 is supported on a base by anti-friction bearings (not shown), such as air bearings or roller bearings, and is driven by an actuator or several actuators, such as linear servo motors and ball screws, by rotary motors, or by any other appropriate manner, as is well known in the art. Stage 110 is driven for instance in the X, Y, and Z coordinate directions in response to the trajectory command provided by position control apparatus 130. Stage 110 may also be controlled in the $\theta_X$, $\theta_Y$, and $\theta_Z$ coordinate directions. (The arrows in FIG. 2 illustrate the X, Y, Z, and $\theta$ directions and are not part of the structure.)

Figure 3:
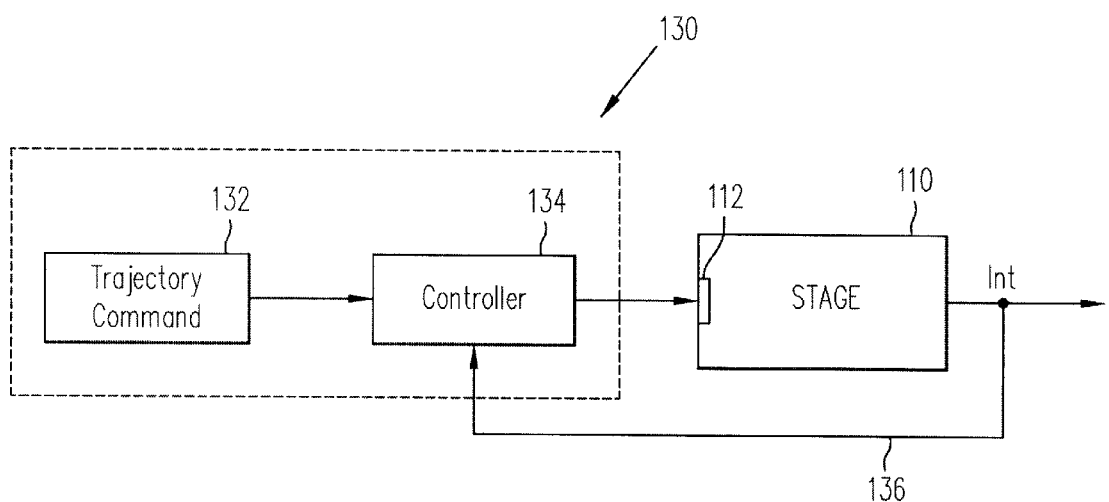
FIG. 3 shows a block diagram of a position control apparatus that provides a trajectory command to a stage in accordance with the present invention.

FIG. 3 is a simplified block diagram of position control apparatus 130, which includes a trajectory command circuit 132, such as a digital signal processor or a micro-processor that provides a trajectory command signal to a controller circuit 134. Trajectory command circuit 132 may be programmed or "hard-wired" to provide the trajectory command in accordance with the present invention, which is well within the skill of those in the art.

Figure 4:
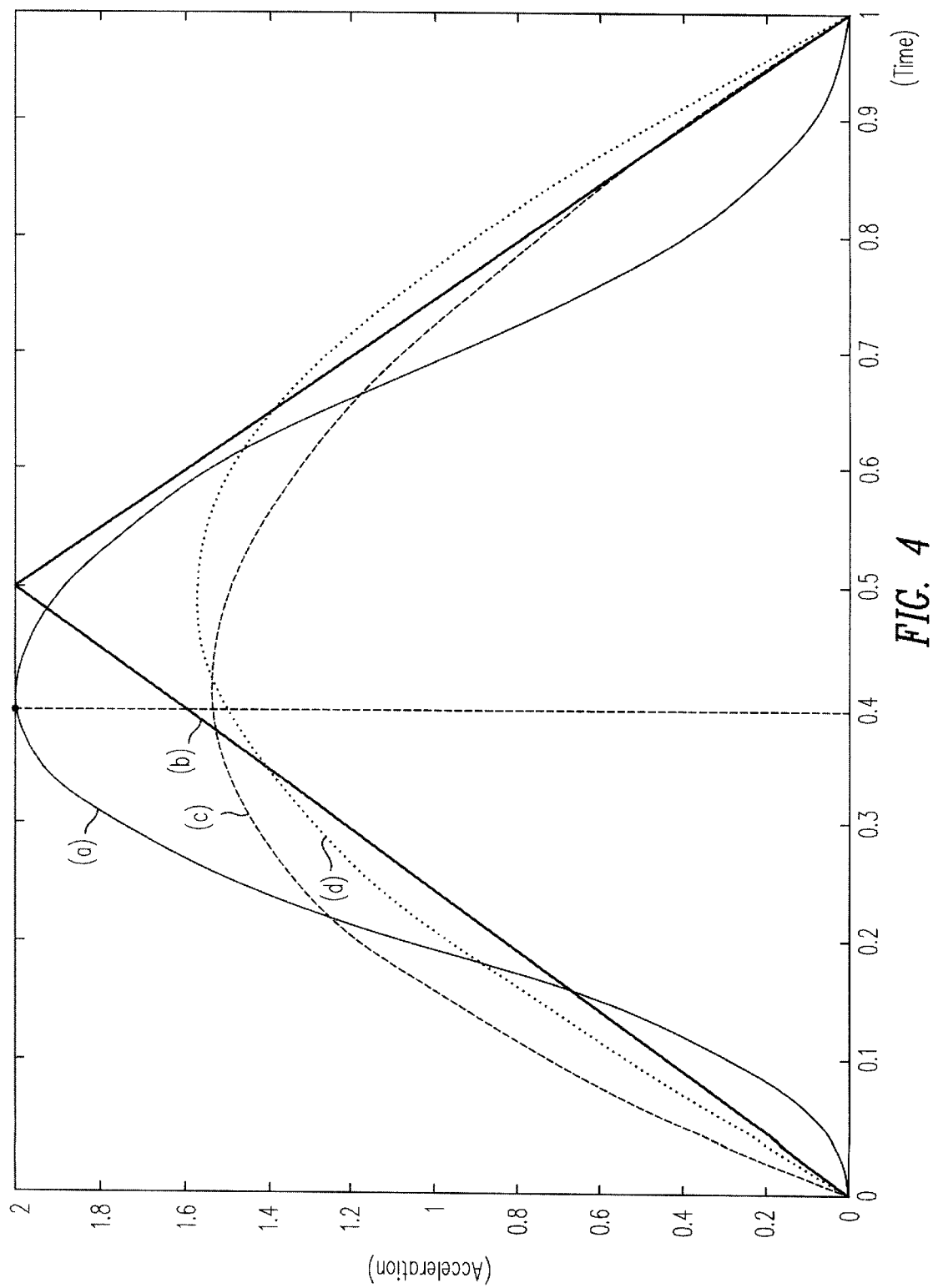
FIG. 4 shows acceleration curves (a) through (d), where acceleration curve (a) is in accordance with an embodiment of the present invention, and acceleration curves (b) through (d) are conventional acceleration curves.

FIG. 4 illustrates acceleration curves, where acceleration curve (a) is an example of a trajectory command in accordance with an embodiment of the present invention that may be stored in trajectory command circuit 132. Acceleration curves (b), (c), and (d) in FIG. 4 illustrate conventional acceleration curves.

Figure 5:
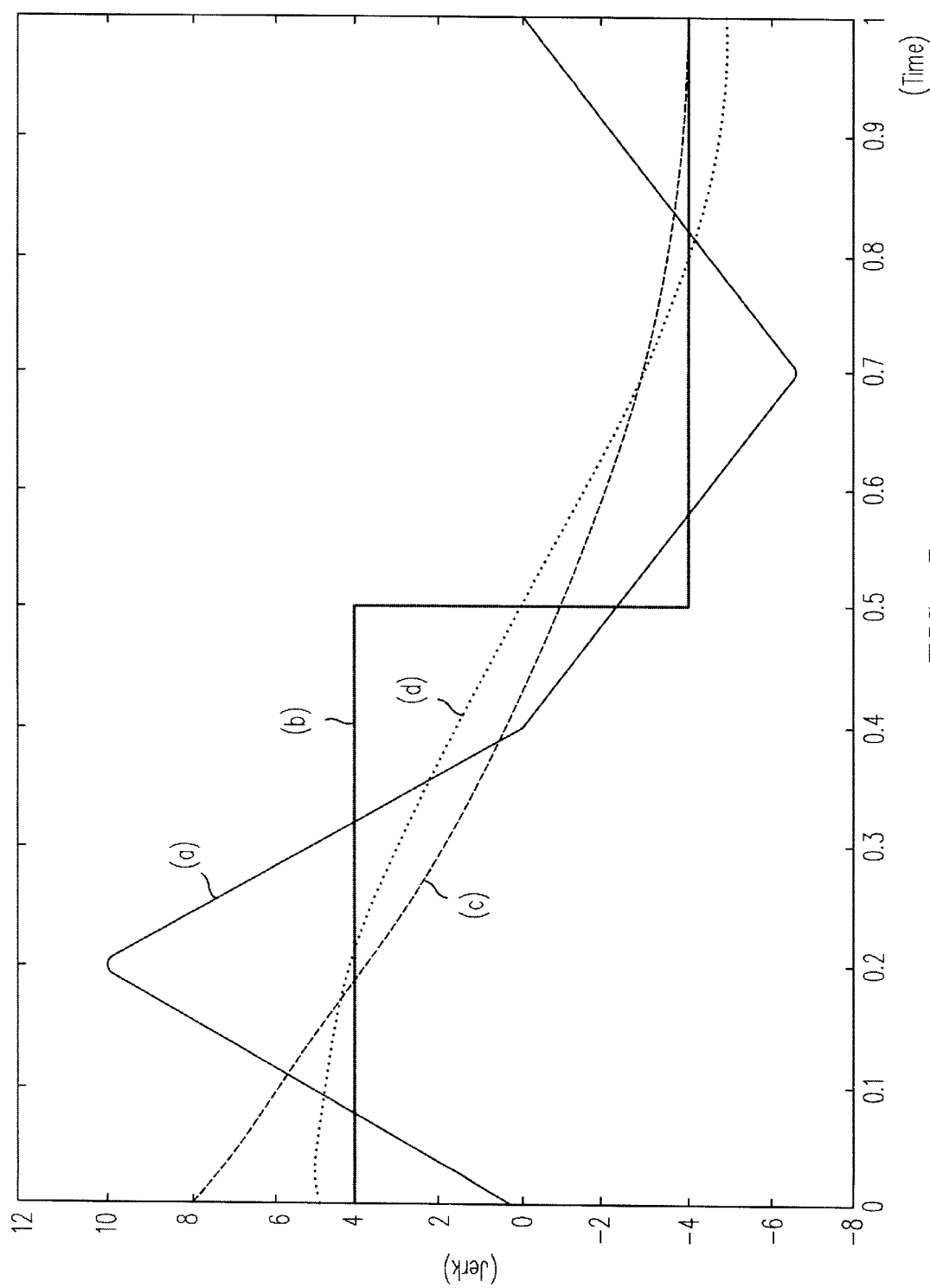
FIG. 5 shows jerk curves (a) through (d), which correspond to like-designated acceleration curves shown in FIG. 4.

FIG. 5 shows jerk curves (a) through (d) which correspond to like-designated acceleration curves shown in FIG. 4. Jerk curve (a) corresponds to acceleration curve (a) and is an example of a trajectory command in accordance with an embodiment of the present invention that may be stored in the trajectory command circuit 132.

As shown in FIG. 5, jerk curve (a) in accordance with an embodiment of the present invention is continously changing because the values of jerk curve (a) at both the beginning of acceleration (t=0) and the end of acceleration (t=1) are zero. In comparison, in the case of conventional jerk curves (b) through (d), the values of the curves are not equal to zero at least at either the beginning of acceleration (t=0) or the end of acceleration (t=1) and, thus, the jerk curves (b) through (d) are changing in a non-continuous manner.

In the present embodiment, because jerk curve (a) is continously changing, vibration generated when stage 110 is driven can be reduced. Thus, the throughput of the exposure apparatus shown in FIG. 2 can be improved.

In addition, in the present embodiment, the timing when the value of acceleration curve (a) peaks is shifted such that the point where vibration is small is the peak of the acceleration. For example, in FIG. 4 the value of acceleration curve (a) peaks when t=0.4. Thus, trajectory command circuit 132 can cancel the control loop's delay and smooth out the acceleration and the deceleration of stage 110.

Controller circuit 134 shown in FIG. 3, which may be a proportion-integration-derivative (PID) circuit, provides an appropriate controller signal to an actuator 112 to move stage 110 in the desired manner. Providing a controller signal to move a stage in response to a trajectory command signal is well within the skill of those who practice the art.

The trajectory command signal produced by trajectory command circuit 132 indicates the desired position of stage 110. Throughout the scanning process, the trajectory command circuit 132 continually updates the desired position of stage 110 such that at every update cycle, stage 110 is moved to its new desired position. Thus, with the appropriate update the stage is imparted with a velocity, acceleration, and jerk, as illustrated respectively in FIGS. 6A–6D. It will be appreciated by those skilled in the art that trajectory command circuit 132 may also control stage 110 in alternative ways, such as updating the desired velocity of stage 110 or updating both the desired position and velocity of stage 110.

A sensor Int, such as an interferometer or linear encoder, conventionally measures the position of stage 110 and provides a position signal indicating the current position of stage 110 via feedback loop 136. The difference between the command signal and the current position is processed by the controller 134, generating the control signal, which drives stage 110 to the desired position. Although position control apparatus 130 as shown in FIG. 3 includes trajectory command circuit 132 and controller circuit 134, it is understood that any position control apparatus can be used to provide a stage with a trajectory command in accordance with the present invention.

FIGS. 6A–6D thereby graphically illustrate the trajectory command imparted by position control apparatus 130 on stage 110 in accordance with the present invention. FIGS. 6A–6D will be explained in terms of driving stage 110 in the X coordinate direction, but it is understood that stage 110 may be driven in the other coordinate directions, such as the Y or Z coordinate directions as shown in FIG. 2, in a similar manner. One skilled in the art will understand that stage 110 may also be driven in accordance with the present invention in an angular direction, for instance, rotating stage 110 in the $\Theta_X$, $\Theta_Y$, or $\Theta_Z$ coordinate directions, as shown in FIG. 2.

Figure 6A:
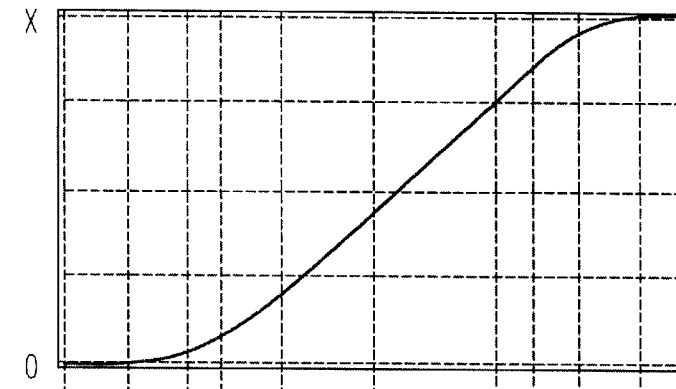
FIGS. 6A–6D show respectively the position, velocity, acceleration, and jerk curves of a stage with respect to time and in accordance with the present invention.

The vertical axes of FIGS. 6A–6D graphically represent the respective position, velocity, acceleration, and jerk of stage 110 with respect to time, which is represented by the horizontal axes of FIGS. 6A–6D. FIG. 6A illustrates the position of stage 110 in the X coordinate direction relative to time. As shown in FIG. 6A, stage 110 moves from position 0 to X between times $t_0$ and $t_9$ in a manner defined by position control apparatus 130, shown in FIG. 3. As illustrated in FIG. 6A, the motion of stage 110 should be smooth with minimal disturbances or discontinuities.

Figure 6B:
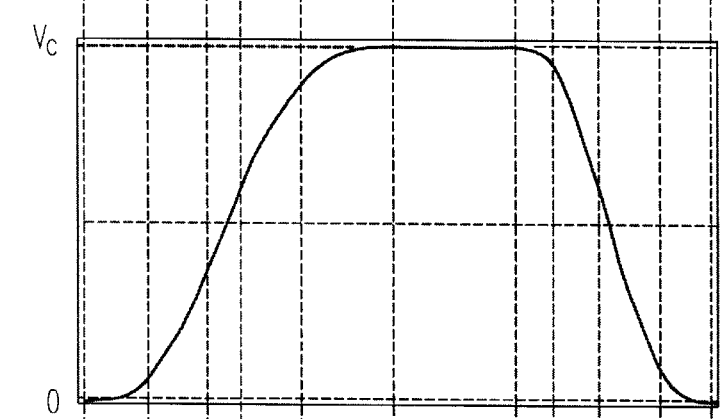

The velocity of stage 110, which is equal to the derivative of the position of stage 110 with respect to time, is shown in FIG. 6B. As shown in FIG. 6B, the velocity of stage 110 has zero velocity prior to time $t_0$ and after time $t_9$ and is at a desired constant velocity $V_C$ between times $t_4$ and $t_5$. Although the trajectory command of the present invention minimizes the settling period, a small settling period will remain. Consequently, in a lithographic system, for example, there will remain a small settling period (not shown) prior to the exposure of the wafer.

Figure 6C:
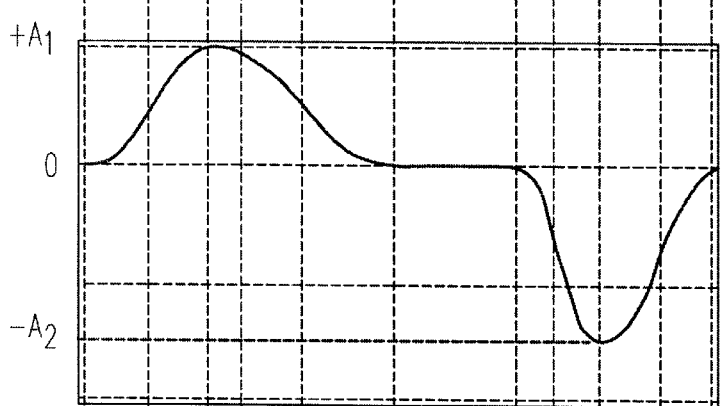

FIG. 6C illustrates the acceleration of stage 110, where the acceleration is equal to the derivative of velocity with respect to time. As shown in FIG. 6C, the acceleration of stage 110 is a smooth non-linear function with a value of zero at times $t_0$, $t_4 t_5$ and $t_9$. Stage 110 starts to accelerate at time $t_0$ and finishes its acceleration at time $t_4$, and reaches a peak acceleration $+A_1$ at time $t_2$. Stage 110 then decelerates between times $t_5$ and $t_9$, reaching its peak deceleration $-A_2$ at time $t_7$. The absolute magnitudes of the acceleration and deceleration, $|+A_1|$ and $|-A_2|$, need not be equal. Because stage 110 has zero acceleration before time t0, after time $t_9$, and between times $t_4$ and $t_5$, stage 110 is at a constant velocity at these times, as illustrated in FIG. 6B.

Figure 6D:
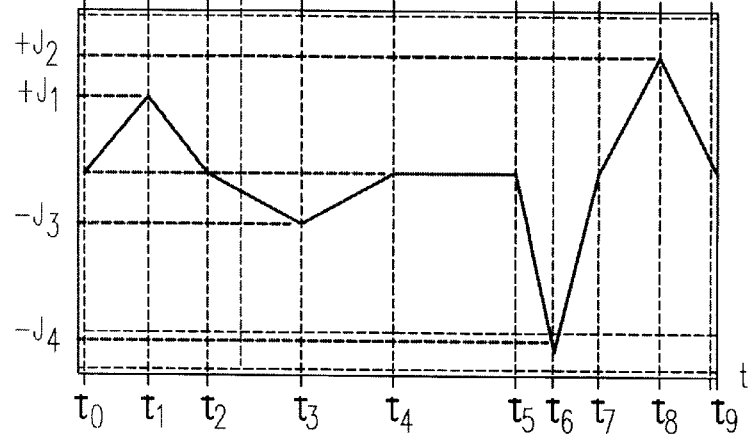

FIG. 6D illustrates the jerk on stage 110 as position control apparatus 130 drives stage 110 according to the trajectory command of the present invention. The jerk on stage 110 is defined as the derivative of the acceleration of stage 110 with respect to time.

As illustrated in FIG. 6D, position control apparatus 130 drives stage 110 such that there is a continuous, piece-wise, linear jerk on stage 110. A command trajectory that uses a continuous, piece-wise, linear jerk is advantageous because it produces a smooth acceleration on stage 110 and a minimal amount of vibration and system structure disturbance. It will be appreciated by those skilled in the art that in another embodiment of the present invention the trajectory command may use a jerk with a sine function waveform as shown in FIG. 7. A sine function waveform jerk is advantageous because it is smoother than a piece-wise linear jerk, however, a sine function waveform jerk is more difficult to implement than a linear jerk, i.e., the programming of the trajectory command in position control apparatus 130 is more complex.

As shown in FIG. 6D, from time $t_0$ to time $t_1$, the jerk linearly increases from zero until it reaches $+J_1$, at which time the jerk linearly decreases until it is again at zero at time $t_2$. The jerk then continues to linearly decrease until it reaches $-J_3$ at time $t_3$ when it then linearly increases until it is back at zero at time $t_4$. The jerk is equal to zero until time $t_5$ at which time the jerk begins to linearly decrease until it reaches $-J_4$ at time $t_6$. The jerk then increases until it reaches $+J_2$ at time $t_8$, passing through zero at time $t_7$. The jerk then decreases until it reaches zero at time $t_9$. It is understood that the absolute peak values of the jerk may all have different values if desired.

As illustrated in FIG. 6D, the jerk is linear with no discontinuities and the value of the jerk at times $t_0$, $t_2$, $t_4$, $t_5$, $t_7$, and $t_9$ is equal to zero. Advantageously, providing a jerk with no discontinuities produces a smooth acceleration on stage 110 and a minimum of vibration and structural disturbances. Because there are no discontinuities in the jerk at the beginning and end of the acceleration periods, $t_0$ to $t_4$ and $t_5$ to $t_9$ as shown in FIG. 6C, there is little disturbance produced by the reactive forces on table mechanism 100, shown in FIG. 2. Consequently, oscillation of table mechanism 100 is reduced.

The acceleration of stage 110 is, of course, the integral of the jerk on stage 110. To ensure that the acceleration of stage 110 is zero at time $t_4$, as shown in FIG. 6C, the integral of the positive jerk on stage 110, between times $t_0$ and $t_2$, should be equal to the integral of the negative jerk on stage 110, between times $t_2$ and $t_4$ Therefore, the ratio between the absolute peak values of the jerk at times $t_1$ and $t_3$ ($+J_1$:$|-J_3|$), should be equal to the ratio between the negative jerk period $T_{N1}$ between times $t_2$ and $t_4$, and the positive jerk period $T_{P1}$ between times $t_0$ and $t_2$ ($T_{N1}$:$T_{P1}$), which is approximately (0.6:0.4) normalized to $t_4$–$t_0$ in FIG. 6D. The ratio is adjustable and is determined by the system response to minimize structural vibration and decrease settling time.

Inversely, during the deceleration of stage 110, the ratio between the absolute peak values of the jerk at times $t_6$ and $t_8$ ($|-J_4|$:$+J_2$), should be equal to the ratio between the positive jerk period $T_{P2}$ between times $t_7$ and $t_9$, and the negative jerk period $T_{N2}$ between times $t_5$ and $t_7$ ($T_{P2}$:$T_{N2}$), which is approximately (0.65:0.35) normalized to $t_9$–$t_5$ in FIG. 6D. It is understood that the ratio and the absolute peak values during the deceleration period of stage 110 may differ from or be equal to the ratio and the absolute peak values during the acceleration period. By minimizing structural vibration during deceleration, the settling time is decreased thereby increasing throughput.

Although the present invention has been described in considerable detail with reference to certain versions thereof, other versions are possible. For example, different ratios between the positive jerk period and negative jerk period may be used. Moreover, different ratios and/or absolute peak values of the jerk may be used during the stage acceleration period and deceleration period. In addition, the jerk may be implemented as a continuous sine wave function as opposed to a piece-wise linear waveform. Therefore, the spirit and scope of the appended claims should not be limited to the description of the versions depicted in the figures.

What is claimed is:

1. A method of driving a stage in a microlithographic apparatus for exposing a wafer, said method comprising:
   accelerating said stage from a first velocity to a second velocity:
      changing a jerk of said stage continuously during said accelerating; and
      maintaining said second velocity of said stage during a time said wafer is being exposed,
      wherein said jerk on said stage is equal to zero at the beginning and end of said accelerating.

2. The method of claim 1, further comprising:
   decelerating said stage from said second velocity to a third velocity; and
   changing a jerk of said stage continuously during said decelerating, wherein said jerk on said stage is equal to zero at the beginning and end of said decelerating.

3. The method of claim 1, wherein said fast velocity is equal to zero.

4. A method of driving a stage to change a velocity of said stage from a first velocity to a second velocity that differs from said first velocity, said method comprising the steps of:
   changing a jerk of said stage continuously with a positive jerk over a first period of time;
   changing a jerk of said stage continuously with a negative jerk over a second period of time; and
   adjusting a first ratio between said second period of time and said first period of time to a desired value.

5. The method of claim 4, further comprising:
   providing a positive first magnitude of said jerk in said first period of time;
   providing a negative second magnitude of said jerk in said second period of time;
   setting a second ratio between the absolute values of said positive first magnitude and said negative second magnitude equal to said first ratio; and
   adjusting said first ratio and second ratio to a desired value.

6. The method of claim 4, wherein said first and second ratios are approximately equal to 3 to 2.

7. The method of claim 5, wherein said step of changing the velocity of said stage is an accelerating step, and the method further comprises a decelerating step to change a velocity of said stage from said second velocity to a third velocity that differs from said second velocity, said decelerating step comprising:
   changing a jerk of said stage with a negative jerk over a third period of time;
   changing a jerk of said stage with a positive jerk over a fourth period of time; and
   adjusting a third ratio between said fourth period of time and said third period of time to a desired value.

8. The method of claim 7 further comprising:
   providing a negative third magnitude of said jerk in said third period of time;
   providing a positive fourth magnitude of said jerk in said fourth period of time;
   setting a fourth ratio between the absolute values of said negative third magnitude and said positive fourth magnitude equal to said third ratio; and
   adjusting said third and fourth ratios to a desired value.

9. The method of claim 8, wherein said first and second ratios and said third and fourth ratios are equal.

10. The method of claim 7, wherein a time when the value of acceleration of said stage peaks is set such that the point where vibration caused by moving of the stage is small is the peak of the acceleration through said first and second periods of time.

11. The method of claim wherein said jerk is equal to zero at the beginning of said first period of time and the end of said second period of time.

12. The method of claim 4, wherein said first velocity is equal to zero.

13. The method of claim 4, wherein driving said first stage is performed in an exposure apparatus to transfer an image formed on a mask onto a substrate, the apparatus having a projection optical system, a first stage arranged to be movable with respect to the projection optical system for mounting said mask thereon, and a second stage arranged to be movable-with-respect to the projection optical system for mounting said substrate thereon.

14. The method of claim 4, wherein driving said first stage is performed in an exposure apparatus to form an image onto a substrate, the apparatus having a projection optical system and substrate stage arranged to be movable with respect to the projection optical system for mounting said substrate thereon.

15. The method of claim 4, wherein driving said first stage is performed in a lithographic apparatus.

16. A method of driving a stage, said method comprising the steps of:
   changing the position of said stage to produce an acceleration on the stage during an acceleration period until said stage reaches a desired velocity;
   changing the position of said stage to produce a desired velocity for a desired period of time; and
   changing the position of said stage to produce a deceleration on the stage during a deceleration period until said stage is stationary;
   wherin a third derivative with respect to time of said changing the position of said stage to produce an acceleration on said stage is continuous and equal to zero at the start and finish of said acceleration period.

17. The method of claim 16, wherein a third derivative with respect to time of said changing the position of said stage to produce a deceleration is continuous and equal to zero at the start and finish of said deceleration period.

18. The method of claim 16, wherein the third derivative with respect to time of said changing the position of said stage to produce an acceleration has a first maximum value produced during a first period of time and a first minimum value produced during a second period of time, and the ratio between said first maximum value and said first minimum value is approximately equal to the ratio between said second period of time and said first period of time.

19. The method of claim 18, wherein the ratio between said first maximum value and said first minimum value is adjustable.

20. The method of claim 17, wherein the third derivative with respect to time of said changing the position of the stage to produce a deceleration has a second minimum value produced during a third period of time and a second maximum value produced during a fourth period of time, and the ratio between said second minimum value and said second maximum value is approximately equal to the ratio between said fourth period of time and said third period of time.

21. A scanning exposure apparatus comprising:
a first stage that holds a substrate, said first stage being movable in a scanning direction;
a second stage that holds a mask;
a projection optical system disposed between said first stage and second stage, said projection optical system projecting an image formed on said mask on said substrate;
an actuator connected with said first stage; and
a controller connected with said actuator, said controller being programmed to provide a motion trajectory signal to said actuator; wherein
said actuator accelerates said first stage from a first velocity to a second velocity in response to said motion trajectory signal, said motion trajectory signal controls said actuator to produce an acceleration of said first stage based on a derivative with respect to time of said acceleration, said derivative of said acceleration is continuous and equal to zero at the start and finish of said acceleration.

22. The apparatus of claim 21, wherein
said actuator decelerates said first stage from a second velocity to a third velocity in response to said motion trajectory signal and
said motion trajectory signal controls said actuator to produce a deceleration of said first stage based on a derivative with respect to time of said deceleration, said derivative of said deceleration is continuous and equal to zero at the start and finish of said deceleration.

23. A stage system comprising:
an actuator;
a movable stage coupled to said actuator;
a position control circuit connected with said actuator, said position control circuit being programmed to provide a motion trajectory signal to said actuator; and
wherein said actuator accelerates said movable stage from a first velocity to a second velocity in response to said motion trajectory signal; and
said motion trajectory signal controls said actuator to produce an acceleration of said movable stage based on a derivative with respect time of said acceleration, said derivative of said acceleration being continuous having a positive segment and a negative segment, said position control circuit adjustably controlling a ratio between said positive and negative segment.

24. The stage system of claim 23, wherein
said actuator decelerates said movable stage from a third velocity to a fourth velocity in response to said motion trajectory signal; and
said motion trajectory signal controls said actuator to produce a deceleration of said movable stage based on a derivative with respect time of said deceleration, said derivative of said deceleration having a positive portion with a first duration and a negative portion with a second duration, the ratio between said first duration and said second duration being adjustable.

25. A stage system comprising:
an actuator;
a controller connected with said actuator, said controller being programmed to provide a motion trajectory signal to said actuator, and
a movable stage connected with said actuator,
wherein said actuator changes a velocity of said movable stage from a first velocity to a second velocity that differs from said first velocity in response to said motion trajectory signal; and
said motion trajectory signal controls said actuator so that a jerk of said movable stage changes continuously with a positive jerk over a first period of time and changes continuously with a negative jerk over a second period of time, and a first ratio between said second period of time and said first period of time is adjustable.

26. The system of claim 25, wherein:
said motion trajectory signal controls said actuator so that a jerk of said movable stage has a positive first magnitude of said jerk in said first period of time, and has a negative second magnitude of said jerk in said second period of time; and
a second ratio between the absolute values of said positive first magnitude and said negative second magnitude is equal to said first ratio.

27. The system of claim 26, wherein said motion trajectory signal produces an acceleration of said movable stage.

28. The system of claim 27, a time when the value of acceleration of said stage peaks is set such that the point where vibration caused by moving of the stage is small is the peak of the acceleration through said first and second periods of time.

29. The system of claim 27, wherein:
said actuator changes a velocity of said movable stage from said second velocity to a third velocity that differs from said second velocity in response to a second motion trajectory signal provide from said controller, and
said second motion trajectory signal controls said actuator so that a jerk of said movable stage changes with a positive jerk over a third period of time and changes with a negative jerk over a fourth period of time, and a third ratio between said fourth period of time and said third period of time is adjustable.

30. The system of claim 29, wherein:
said second motion trajectory signal controls said actuator so that a jerk of said movable stage has a negative third magnitude of said jerk in said third period of time, and has a positive fourth magnitude of said jerk in said fourth period of time; and
a fourth ratio between the absolute values of said negative third magnitude and said positive fourth magnitude is equal to said third ratio.

31. The system of claim 30, wherein said first and second ratios and said third and fourth ratios are equal.

32. The system of claim 25, wherein said jerk is equal to zero at the beginning of said first period of time and the end of said second period of time.

33. An exposure apparatus comprising:
an optical system that forms an image on a substrate;
a substrate stage that supports said substrate;
an actuator connected with said substrate stage; and
a controller connected with said actuator, said controller being progmmmed to provide a motion trajectory signal to said actuator,
wherein said actuator changes a velocity of said substrate stage from a first velocity to a second velocity that differs from said first velocity in response to said motion trajectory signal; and
said motion trajectory signal controls said actuator so that a jerk of said substrate stage changes continuously with a positive jerk over a first period of time and changes continuously with a negative jerk over a second period of time, and a first ratio between said second period of time and said first period of time is adjustable.

34. An exposure apparatus comprising:

an optical system that images a pattern formed in a mask onto a substrate;

a mask stage that supports said mask;

an actuator connected with said mask stage; and a controller connected with said actuator, said controller being programmed to provide a motion trajectory signal to said actuator, wherein said actuator changes a velocity of said mask stage from a first velocity to a second velocity that differs from said first velocity in response to said motion trajectory signal; and said motion trajectory signal controls said actuator so that a jerk of said mask stage changes continuously with a positive jerk over a first period of time and changes continuously with a negative jerk over a second period of time, and a first ratio between said second period of time and said first period of time is adjustable.

* * * * *